United States Patent
Ward et al.

[19]

[11] Patent Number: 5,988,186

[45] Date of Patent: Nov. 23, 1999

[54] AQUEOUS STRIPPING AND CLEANING COMPOSITIONS

[75] Inventors: Irl E. Ward, Bethlehem; Francis Michelotti, Easton, both of Pa.

[73] Assignee: Ashland, Inc., Dublin, Ohio

[21] Appl. No.: 08/951,424

[22] Filed: Oct. 16, 1997

Related U.S. Application Data

[63] Continuation-in-part of application No. 08/590,883, Jan. 24, 1996, abandoned, which is a continuation of application No. 08/501,206, Jul. 11, 1995, Pat. No. 5,556,482, which is a continuation-in-part of application No. 08/433,677, May 4, 1995, abandoned, which is a continuation-in-part of application No. 07/983,257, Nov. 30, 1992, Pat. No. 5,417,877, which is a continuation-in-part of application No. 07/647,487, Jan. 25, 1991, abandoned.

[51] Int. Cl.$^6$ ............................. C11D 7/26; C11D 7/32; B08B 3/04

[52] U.S. Cl. ..................... 134/1.3; 134/3; 134/38; 510/176

[58] Field of Search ............................. 510/176; 134/1.3, 134/3, 38

[56] References Cited

U.S. PATENT DOCUMENTS

| | | | |
|---|---|---|---|
| 4,395,348 | 7/1983 | Lee | 252/143 |
| 4,610,953 | 9/1986 | Hashimoto et al. | 430/331 |
| 4,770,713 | 9/1988 | Ward | 134/38 |
| 4,859,418 | 8/1989 | Ohlendorf et al. | 422/16 |
| 5,190,723 | 3/1993 | Phillips et al. | 422/15 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,381,807 | 1/1995 | Lee | 134/2 |
| 5,419,779 | 5/1995 | Ward | 134/38 |
| 5,419,877 | 5/1995 | Ward | 252/153 |
| 5,496,491 | 3/1996 | Ward et al. | 252/153 |
| 5,556,482 | 9/1996 | Ward et al. | 134/38 |
| 5,563,119 | 10/1996 | Ward | 510/176 |
| 5,597,420 | 1/1997 | Ward | 134/38 |
| 5,648,324 | 7/1997 | Honda et al. | 510/176 |
| 5,665,688 | 9/1997 | Honda et al. | 510/178 |
| 5,698,503 | 12/1997 | Ward et al. | 510/176 |
| 5,707,947 | 1/1998 | Ward et al. | 510/176 |
| 5,709,756 | 1/1998 | Ward et al. | 134/1.3 |
| 5,753,601 | 5/1998 | Ward et al. | 510/176 |

FOREIGN PATENT DOCUMENTS 647884  4/1995  European Pat. Off. .

OTHER PUBLICATIONS

Morrison and Boyd, Organic Chemistry, 3rd ed., Allyn and Bacon, Inc., p. 727, Month not known. 1973.

*Primary Examiner*—Paul Lieberman
*Assistant Examiner*—Gregory R. Delcotto
*Attorney, Agent, or Firm*—John Lezdey & Assoc

[57] ABSTRACT

An aqueous stripping composition comprising a mixture of a polar amine, an organic or inorganic amine and a corrosion inhibitor which is gallic acid, its ester or analog. The stripping composition is effective to strip photoresists, residues from plasma process generated organic, metal-organic materials, inorganic salts, oxides, hydroxides or complexes in combination with or exclusive of organic photoresist films at low temperatures without redepositing any substantial amount of metal ions.

10 Claims, 2 Drawing Sheets

AQUEOUS STRIPPING AND CLEANING COMPOSITIONS

RELATED APPLICATIONS

This application is a continuation-in-part of Ser. No. 08/590,883 filed Jan. 24, 1996, now abandoned, which is a continuation of Ser. No. 08/501,206 filed Jul. 11, 1995, now U.S. Pat. No. 5,556,482, which is a continuation-in-part of Ser. No. 08/433,677 filed May 4, 1995, abandoned, which is a continuation-in-part of Ser. No. 07/983,257 filed Nov. 30, 1992, now U.S. Pat. No. 5,417,877, which is a continuation-in-part of Ser. No. 07/647,487 filed Jan. 25, 1991, abandoned.

BACKGROUND OF THE INVENTION

1. Field of the Invention

This invention relates to an improvement in aqueous stripping compositions particularly useful for stripping paints, varnishes, enamels, photoresists and the like, from various substrates. More particularly, the invention relates to improved aqueous stripping compositions comprising polar solvents and organic or inorganic amines by providing a corrosion inhibitor which is gallic acid or a gallic acid ester. The compositions do not include hydroxylamine.

2. Description of the Prior Art

Stripping compositions used for removing coatings from substrates have for the most part been highly flammable compositions, compositions generally hazardous to both humans and the environment and compositions which are reactive solvent mixtures evidencing an undesirable degree of toxicity. Moreover, these stripping compositions are not only toxic but their disposal is costly since they must be disposed of as a hazardous waste. In addition, these stripping compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood, metal or silicon wafers. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions.

Additionally, because many of the toxic components of such stripping compositions are highly volatile and subject to unduly high evaporation rates, the stripping compositions require special human and environmental safety precautions to be taken during storage and use of said compositions.

In photoresist stripping with the use of hydroxylamine and an amine solvent there is the problem with the substrate of titanium etching and aluminum etching. It is therefore desirable to provide a corrosion inhibitor so that such compositions can be used on a various kinds of photoresists.

U.S. Pat. No. 4,276,186 to Bakos et al discloses a cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the invention.

U.S. Pat. No. 4,617,251 to Sizensky discloses a stripping composition which is prepared with a select amine and an organic polar solvent. The composition is formed utilizing from about 2 to about 98% by weight of amine compound and about 98 to about 2% of an organic polar solvent.

U.S. Pat. No. 4,770,713 to Ward discloses a stripping composition comprising an alkylamine and an alkanol amine.

U.S. Pat. No. 5,419,779 to Ward discloses a process for removing an organic coating from a substrate by applying a composition consisting of about 62% by weight of monothanolamine, about 19% by weight hydroxylamine, a corrosion inhibitor which includes gallic acid and gallic acid esters, and water.

U.S. Pat. No. 5,496,491 to Ward, which is incorporated herein by reference, discloses a photoresist stripping composition comprising a basic amine, a polar solvent and an inhibitor which is the reaction product of an alkanolamine and a bicyclic compound. However, gallic acid and gallic acid esters are not disclosed as inhibitors.

U.S. Pat. Nos. 5,334,332 and 5,275,771 to Lee disclose a composition containing hydroxylamine, an alkanolamine and a chelating agent. However, the chelating agent is not gallic acid or its esters.

U.S. Pat. No. 5,597,420 to Ward discloses a stripping composition free of hydroxylamine compounds which consists essentially of monoethanolamine and water together with a corrosion inhibitor. The inhibitor includes gallic acid and its esters.

Recently, OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available photoresist stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, are water miscible and are biodegradable. It is also desirable to provide stripping compositions that are substantially non-flammable, non-corrosive, evidence relatively little, if any, tendency to evaporate and are generally unreactive and also of little toxicity to humans and are environmentally compatible.

Moreover, it would be desirable to provide photoresist stripping compositions that have a high degree of stripping efficacy and particularly such high degree of stripping at lower temperatures than generally required with prior stripping compositions.

It is also highly desirable that photoresist stripping compositions be provided that exhibit substantially no corrosive effects on the substrate, especially those containing titanium and/or aluminum or silicone.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

It is also most advantageous that stripping compositions be provided with the above-identified desirable characteristics which evidence synergistic stripping action in that the mixtures of components provide stripping efficacy and stripping results not always obtainable with the individual components for the removal of sidewall organometallic and metal oxide residues.

SUMMARY OF THE INVENTION

It has now been found that a suitable stripping and cleaning composition in which the hereinbefore mentioned disadvantages or drawbacks of corrosion are eliminated or substantially reduced and in which the range of usefulness of the stripping compositions is greatly extended can be obtained in accordance with the teachings of the present invention.

In a stripping composition containing the admixture of water, a soluble polar solvent and an organic or inorganic amine, the improvement which comprises in admixture therewith an effective amount of corrosion inhibitor which is a compound of the general formula:

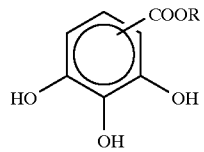

(I)

wherein R is hydrogen or lower alkyl.

The corrosion inhibitor is believed to form a 5-or 6-membered ring coordination complex with the substrate. Gallic acid is a more effective inhibitor than catechol because it is a more effective oxygen scavenger and has more sites for ligand attachment. That is, gallic acid has more effective covalent bonds. A preferred amount of inhibitor is about 0.1 to 10% by weight. The compositions can be non-aqueous or can include water.

The novel stripping compositions of the invention exhibit synergistically enhanced stripping action and stripping capabilities at low temperatures not possible from the use of the individual components or in combination with other stripping components such as N-methylpyrrolidone or alkylamides without the occurrence of corrosion.

The stripping compositions of the invention with the corrosion inhibitor provide an effective stripping action as well as prevent metal ion redeposition, for example, alkaline earth and alkali metal ion redeposition on the substrate.

It is a general object of the invention to provide a non-corroding stripping composition which is effective at low temperatures.

It is another object of the invention to provide a photoresist stripping composition which is non-corrosive especially of aluminum and silicone.

It is a further object of the invention to provide a photoresist stripping composition which inhibits redeposition of metal ions.

It is still another object of the invention to provide an inhibitor which is less expensive and is more effective as a corrosion inhibitor than catechol.

It is yet another object of the invention to provide a method for stripping a coated substrate which can be accomplished at low temperatures which does not cause redeposition of metal ions.

Other objects and advantages of the present invention will be more fully understood in view of the accompanying drawing and a description of the preferred embodiments.

DETAILED DESCRIPTION OF THE PREFERRED EMBODIMENTS

Figure 1A:
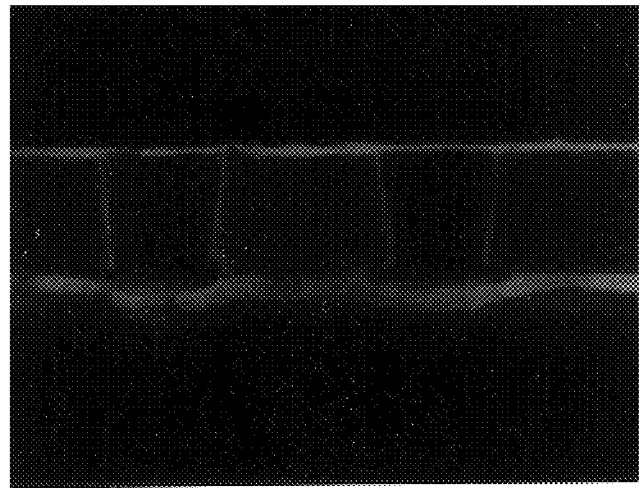
FIGS. 1A–2C show a SEM comparison between a formulation of the invention with gallic acid and a similar formulation with catechol.

The stripping compositions of the invention preferably comprise an admixture of a polar solvent and an organic or inorganic amine in combination with about 0.1 to 10% by weight of a corrosion inhibitor which is a compound of the general formula:

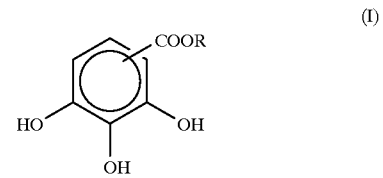

(I)

wherein R is hydrogen or lower alkyl.

A preferred photoresist stripping composition consists of about 58 to 63% by weight of N-monoethanolamine, about 30 to 40% by weight of dimethyl sulfoxide, about 1 to 4% by weight of gallic acid and water.

If desired, up to about 5% by weight of anthranilic acid may also be added as a corrosion inhibitor.

The polar solvents which can be used in the present invention include and are not limited to water, polyhydric alcohols, for example, propylene glycol, glycol, glycerol, polyethylene glycol, and the like, dimethylsulfoxide (DMSO), butyrolactones, glycol ethers, N-alkyl pyrolidones, for example N-methyl pyrrolidone, tetrahydrofuran (THF) glycol ethers including diethylene glycol monoalkyl ether, ethylene diamine, ethylenetriamine, dimethylacetamide (DMAC), and the like.

The amines which can be used in the present invention include but are not limited to tetralkylammonium hydroxide, a diamino or an amino hydroxy compound such as described in U.S. Pat. Nos. 4,765,844 and 4,617,251 which are herein incorporated by reference, alkanolamines, which are primary, secondary or tetiary having from 1 to 5 carbon atoms, morpholine, N-methylaminoethanol, and the like. Optional ingredients includes surfactents.

The stripping compositions of this invention are especially useful and advantageous for numerous reasons among which may be mentioned the following. The stripping compositions are water soluble, non-corrosive, non-flammable and of low toxicity to the environment. The stripping compositions evidence higher stripping efficiency at low temperatures for a wide variety of coatings and substrates. They are particularly suitable for removal of photoresists and residues from plasma processing used in integrated circuit fabrication since they also prevent the redeposition of metal ions, especially sodium and potassium ions.

The stripping compositions are easily prepared by simply mixing the components at room temperature.

The method of the invention is carried out by contacting an organic or metal-organic polymer, inorganic salt, oxide, hydroxide or complex or combination thereof as a film or residue, (i.e. sidewall polymer (SWP)) . with the described stripping composition. The actual conditions, i.e., temperature, time, etc. depend on the nature and thickness of the complex (photoresist and/or sidewall polymer) material to be removed, as well as other factors familiar to those skilled in the art. In general, for photoresist stripping, the photoresist is contacted or dipped into a vessel containing the stripping composition at a temperature between 25–75° C. for a period of about 5–30 minutes, washed with water and then dried with an inert gas.

Examplificative organic polymeric materials include photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues (sidewall polymer) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, etc.

The effectiveness and unexpected nature of the stripping compositions of the invention is illustrated, but not limited by, the data presented in the following examples. Unless otherwise specified, all parts and percentages are by weight.

EXAMPLE 1

In order to demonstrate the efficiency of the different concentrations of the stripping and cleaning compositions the following tests were conducted.

Metal/silicon wafer substrates containing commercial photoresists and plasma generated SWP residues labeled as "veils" were post-baked at 180° C. for 60 minutes. The substrates were cooled and dipped into vessels containing a stripping composition and stirred with a magnetic stirrer. There was a vessel containing a stripping composition maintained at a temperature of 50° C. and another at 55° C. The contact time with the compositions was 20 to 30 minutes. The substrates were washed with deionized water and dried with nitrogen. The results were determined by optical microscopy and scanning electron microscopy inspection and were as follows:

| | Example 1 % Wt Sample No. | | | | | |
|---|---|---|---|---|---|---|
| Ingredient | 1 | 2 | 3 | 4 | 5 | 7 |
| MEA | | | | | 58.0% | 58.0% |
| NMEA | 59.2% | 62.5% | 62.0% | 78.0% | | |
| DMSO | | 36.5% | | | 30.0% | 30.0% |
| Water | 33.1% | | 38.0% | 20.0% | 10.0% | 10.0% |
| Catechol | 4.7% | | | | 2.0% | |
| Gallic Acid | | 1.0% | | 2.0% | | 2.0% |

Results

Sample 3 showed severe corrosion in VIAS at 75° C. Sample 1, 3 and 5 in VIAS at 75% showed some SWP residue or corrosion. Samples 2, 4 and 7 showed better inhibitor performance against aluminum etching than other samples.

Figure 1B:
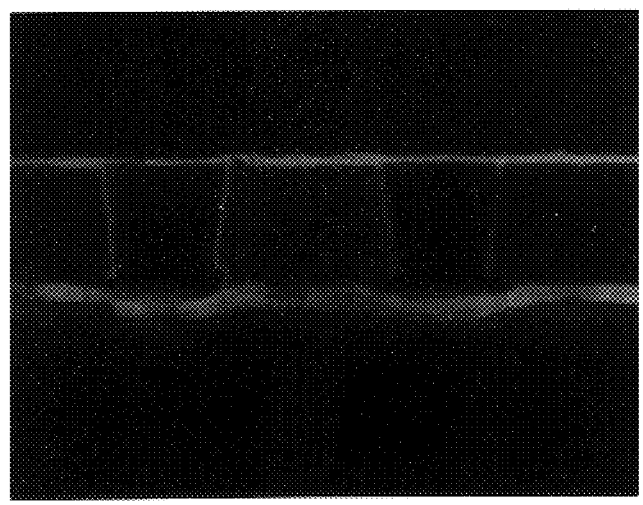
Figure 1C:
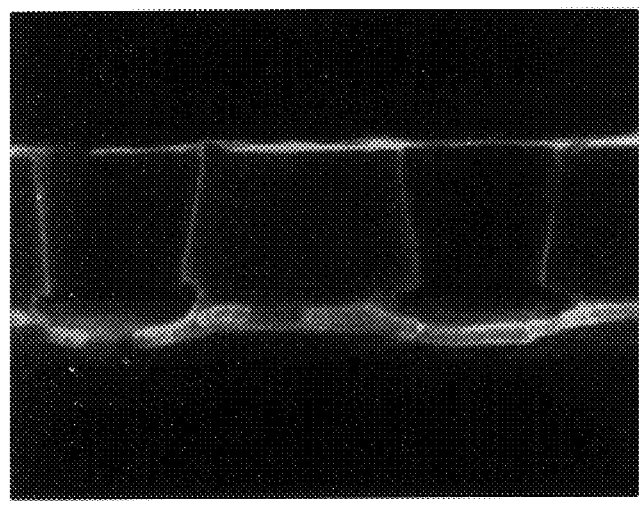
Figure 2A:
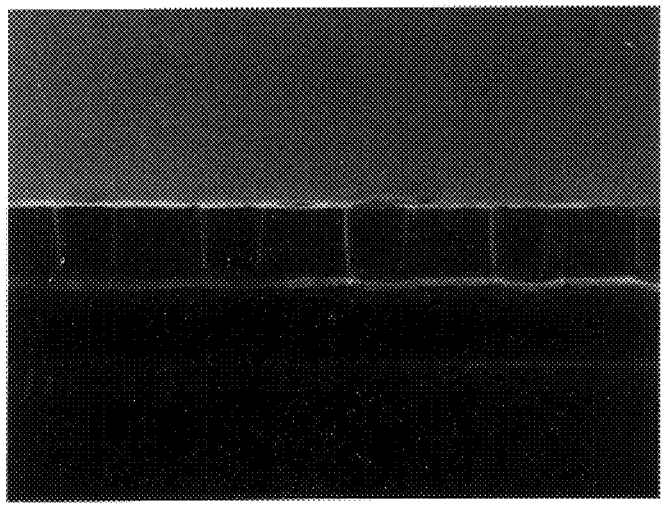
Figure 2B:
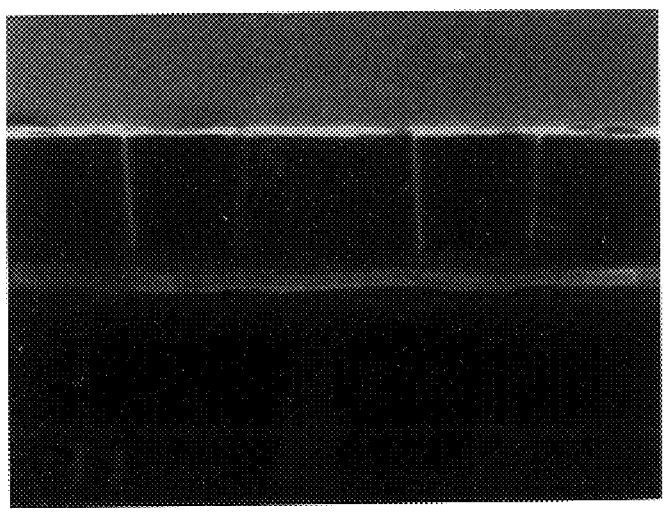
Figure 2C:
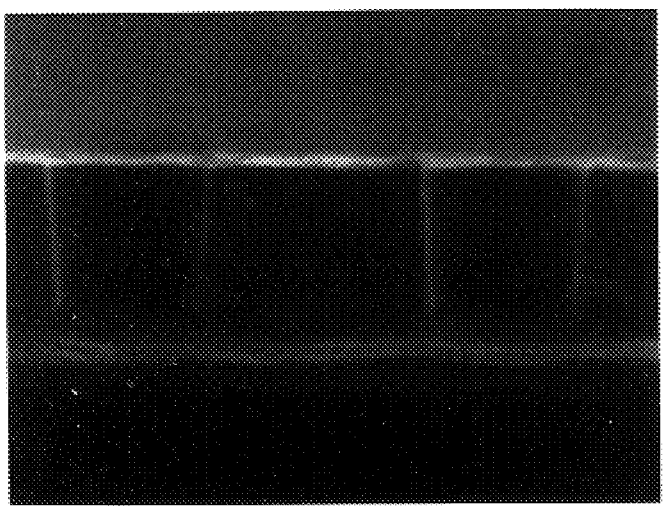

FIG. 1A–1C show the stripping results of composition 5 or a photoresist at 90° C. and FIGS. 2A–2C show the results of composition 7 on a photoresist under the same conditions.

EXAMPLE 2

The following stripping and cleaning compositions were prepared and tested according to the test of example 1.

| Composition 1 | | Time(min) | Temp. °C. | % Polymeric Removal | Corrosion |
|---|---|---|---|---|---|
| Monoethanolamine | 60% | 20 | 65 | 100 | No |
| DMAC | 17.5% | 20 | 90 | 100 | No |
| Water | 17.5% | | | | |
| Catechol | 5% | | | | |
| Composition 2 | | | | | |
| AEE | 60% | 20 | 65 | 100 | No |
| NNP | 17.5% | 20 | 90 | 100 | Pitting |
| Water | 17.5% | | | | |
| Catechol | 5% | | | | |
| Composition 3 | | | | | |
| AEE | 60% | 20 | 65 | 100 | No |
| NMP | 17.5% | 20 | 90 | 100 | No |
| Water | 17.5% | | | | |
| Gallic Acid | 5% | | | | |
| Composition 4 | | | | | |
| Tetramethyl ammonium hydroxide | 9.7% | 20 | 65 | 100 | Pitting |
| Pentahydrate (TMAH) | | 20 | 90 | 100 | Pitting |

-continued

| Composition 1 | | Time(min) | Temp. °C. | % Polymeric Removal | Corrosion |
|---|---|---|---|---|---|
| Dipropyleneglycol monoethylether | 21.0% | | | | |
| DMSO | 69.3% | | | | |
| Composition 5 | | | | | |
| TMAH | 9.7% | 20 | 65 | 100 | No |
| Dipropyleneglycol monoethylether | 21.0% | 20 | 90 | 100 | No |
| DMSO | 65.0% | | | | |
| Gallic Acid | 4.3% | | | | |

What is claimed is:

1. In an aqueous stripping and cleaning composition for removing organic and inorganic matter comprising an admixture of at least about 10% by weight water, a water soluble polar solvent and an organic amine, the improvement which comprises the admixture with an effective amount of a corrosion inhibitor of the general formula:

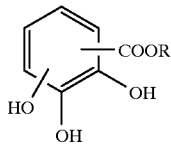

(I)

wherein R is lower alkyl or hydrogen.

2. The stripping and cleaning composition of claim 1 wherein said corrosion inhibitor comprises about 0.1 to 10% by weight.

3. The stripping and cleaning composition of claim 1 comprising 10 to 20% by weight water.

4. The stripping and cleaning composition of claim 1 comprising about 58 to 63% by weight of N-monoethanolamine, about 30 to 40% by weight of dimethyl sulfoxide, about 1 to 4% by weight of gallic acid and the remainder being water.

5. The stripping and cleaning composition of claim 1 including up to about 5% by weight of anthranilic acid.

6. The stripping and cleaning composition of claim 1 wherein said polar solvent is dimethylsulfoxide.

7. The stripping and cleaning composition of claim 1 wherein said polar solvent is dimethylacetamide.

8. A process for removing a coating from a coated substrate comprising applying to said coated substrate a stripping and cleaning effective amount of the composition of claim 1, permitting said stripping composition to reside on said coated substrate for a stripping effective period of time and removing the coating from said substrate.

9. A process for removing a coating from a coated substrate comprising applying to said coated substrate a stripping and cleaning effective amount of the composition of claim 3, permitting said stripping composition to reside on said coated substrate for a stripping effective period of time and removing the coating from said substrate.

10. A process for removing a coating from a coated substrate comprising applying to said coated substrate a stripping and cleaning effective amount of the composition of claim 7, permitting said stripping composition to reside on said coated substrate for a stripping effective period of time and removing the coating from said substrate.

* * * * *